United States Patent
Yang et al.

(10) Patent No.: US 12,213,372 B2
(45) Date of Patent: Jan. 28, 2025

(54) OLED DISPLAY PANEL AND DISPLAY DEVICE

(71) Applicant: BOE TECHNOLOGY GROUP CO., LTD., Beijing (CN)

(72) Inventors: Wei Yang, Beijing (CN); Guangcai Yuan, Beijing (CN); Ce Ning, Beijing (CN); Xinhong Lu, Beijing (CN); Tianmin Zhou, Beijing (CN); Xin Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 447 days.

(21) Appl. No.: 17/732,781

(22) Filed: Apr. 29, 2022

(65) Prior Publication Data
US 2022/0255025 A1    Aug. 11, 2022

Related U.S. Application Data

(63) Continuation-in-part of application No. 16/765,216, filed as application No. PCT/CN2019/123654 on Dec. 6, 2019, now Pat. No. 11,362,114.

(30) Foreign Application Priority Data

Dec. 7, 2018    (CN) .......................... 201811497063.7

(51) Int. Cl.
*H01L 51/00*    (2006.01)
*H10K 59/124*    (2023.01)
(Continued)

(52) U.S. Cl.
CPC ......... *H10K 77/111* (2023.02); *H10K 59/124* (2023.02); *H10K 59/131* (2023.02)

(58) Field of Classification Search
CPC .. H10K 77/111; H10K 59/124; H10K 59/131; H10K 59/1201; H01L 27/1218;
(Continued)

(56) References Cited

U.S. PATENT DOCUMENTS 9,147,719 B2    9/2015    Kim et al.
2015/0123084 A1    5/2015    Kim et al.
(Continued)

FOREIGN PATENT DOCUMENTS

CN    104752345 A    7/2015
CN    106024838 A    10/2016
(Continued)

OTHER PUBLICATIONS

Office action from U.S. Appl. No. 16/765,216 dated Sep. 1, 2021.
(Continued)

*Primary Examiner* — Mohammed R Alam
(74) *Attorney, Agent, or Firm* — Calfee, Halter & Griswold LLP

(57) ABSTRACT

The present disclosure relates to an OLED display panel and display device. The OLED display panel includes: a display area, a bending area and a bonding area for bonding a circuit board, wherein the display panel further includes: a base substrate; a first semiconductor pattern on the base substrate; a first insulating layer group on the first semiconductor pattern; a second semiconductor pattern on the first insulating layer group; a second insulating layer group on the second semiconductor pattern; first via holes in the first insulating layer group and the second insulating layer group; second via holes in the second insulating layer group, wherein the display panel further includes: a first groove located in the bending area and having a depth substantially identical to that of the first via holes; and a metal trace, connecting a trace in the display area to the circuit board.

20 Claims, 4 Drawing Sheets

(51) Int. Cl.
*H10K 59/131* (2023.01)
*H10K 77/10* (2023.01)

(58) Field of Classification Search
CPC ............ H01L 27/1244; H01L 27/1248; H01L 27/1225
See application file for complete search history.

(56) References Cited

U.S. PATENT DOCUMENTS

| | | | |
|---|---|---|---|
| 2016/0163743 A1 | 6/2016 | Kimura et al. | |
| 2017/0294459 A1 | 10/2017 | Lee | |
| 2018/0090700 A1* | 3/2018 | Nishinohara | H10K 50/80 |
| 2019/0198534 A1 | 6/2019 | Je et al. | |
| 2020/0326571 A1* | 10/2020 | Hanada | H10K 59/1201 |

FOREIGN PATENT DOCUMENTS

| | | |
|---|---|---|
| CN | 107275334 A | 10/2017 |
| CN | 107681063 A | 2/2018 |
| CN | 108288621 A | 7/2018 |
| CN | 108493198 A | 9/2018 |
| CN | 109671720 A | 4/2019 |
| WO | 2019/196410 A1 | 10/2019 |
| WO | 2020/114485 A1 | 6/2020 |

OTHER PUBLICATIONS

Notice of Allowance from U.S. Appl. No. 16/765,216 dated Feb. 7, 2022.
International Search Report and Written Opinion from PCT/CN2019/123654 dated Feb. 28, 2020.
Office action from Chinese Application No. 201811497063.7 dated Jun. 15, 2020.

* cited by examiner

OLED DISPLAY PANEL AND DISPLAY DEVICE

CROSS REFERENCE TO RELATED APPLICATIONS

This application is a CIP of U.S. application Ser. No. 16/765,216, which is the national stage entry of PCT/CN2019/123564, filed on Dec. 6, 2019, which is based upon and claims priority to Chinese Patent Application No. 201811497063.7, filed on Dec. 7, 2018, the entire contents of which are incorporated herein by reference.

TECHNICAL FIELD

The present disclosure relates generally to display technology and, more particularly, to an OLED display panel and display device.

BACKGROUND

In the display industry, display devices in which active layers of thin film transistors are respectively made of low temperature poly-silicon (LTPS) and metal oxide have received much attention.

The thin film transistor made of the low-temperature polysilicon has the advantages of high mobility and fast charging while the thin film transistor made of metal oxide has the advantage of low leakage current. The user experience of a display device will be significantly improved if the two kinds of materials having the above-mentioned advantages are combined to form the display device. However, manufacturing processes of the low-temperature polysilicon and the metal oxide are quite different, that is, the processing compatibility is poor and it is difficult to guarantee the stability of the processes.

Therefore, it is necessary to study a new OLED display panel and display device.

The aforementioned information disclosed in this part are only for better understanding of the background of the present disclosure and thus, it can include information that is not prior art already known to those of ordinary skill in the art.

SUMMARY

The objective of the present disclosure is to provide an OLED display panel and display device with good processing compatibility.

Additional aspects and advantages of the present disclosure will be partly set forth in the following description, and will partly become apparent from the description, or may be learned from the practice of the present disclosure.

According to an aspect of the present disclosure, there is provided an OLED display panel, including:
a display area, a bending area and a bonding area for bonding a circuit board,
wherein the display panel further includes:
a base substrate;
a first semiconductor pattern on the base substrate;
a first insulating layer group on the first semiconductor pattern;
a second semiconductor pattern on the first insulating layer group;
a second insulating layer group on the second semiconductor pattern;
first via holes in the first insulating layer group and the second insulating layer group;
second via holes in the second insulating layer group,
wherein the display panel further includes:
a first groove located in the bending area and having a depth substantially identical to that of the first via holes; and
a metal trace, connecting a trace in the display area to the circuit board.

In some embodiments of the disclosure, an orthographic projection of the first semiconductor pattern on the base substrate does not overlap an orthographic projection of the second semiconductor pattern on the base substrate.

In some embodiments of the disclosure, the first semiconductor pattern and the second semiconductor pattern are made of different materials.

In some embodiments of the disclosure, the first semiconductor pattern is made of polysilicon and the second semiconductor pattern is made of metal oxide.

In some embodiments of the disclosure, an orthographic projection of the metal trace on the base substrate at least partially overlaps an orthographic projection of the first groove on the base substrate.

In some embodiments of the disclosure, the first insulating layer group includes a first gate insulating layer, a first interlayer dielectric layer and a second buffer layer, the second insulating layer group includes a second gate insulating layer and a second interlayer dielectric layer.

In some embodiments of the disclosure, the display panel further includes a second groove having a depth substantially identical to that of the second via holes.

In some embodiments of the disclosure, the first groove and the first via holes are formed through an identical patterning process, the second groove and the second via holes are formed through an identical patterning process.

In some embodiments of the disclosure, the bending area further includes a first planarization layer, and the metal trace is located on the first planarization layer.

In some embodiments of the disclosure, the display panel further includes a source electrode and a drain electrode on the first planarization layer, the metal trace, the source electrode and the drain electrode are formed through an identical patterning process.

According to another aspect of the present disclosure, there is provided an OLED display device, including an OLED display panel, OLED display panel including a display area, a bending area and a bonding area for bonding a circuit board,
wherein the display panel further includes:
a base substrate;
a first semiconductor pattern on the base substrate;
a first insulating layer group on the first semiconductor pattern;
a second semiconductor pattern on the first insulating layer group;
a second insulating layer group on the second semiconductor pattern;
first via holes in the first insulating layer group and the second insulating layer group;
second via holes in the second insulating layer group,
wherein the display panel further includes:
a first groove located in the bending area and having a depth substantially identical to that of the first via holes; and
a metal trace, connecting a trace in the display area to the circuit board.

In some embodiments of the disclosure, an orthographic projection of the first semiconductor pattern on the base substrate does not overlap an orthographic projection of the second semiconductor pattern on the base substrate.

In some embodiments of the disclosure, the first semiconductor pattern and the second semiconductor pattern are made of different materials.

In some embodiments of the disclosure, the first semiconductor pattern is made of polysilicon and the second semiconductor pattern is made of metal oxide.

In some embodiments of the disclosure, an orthographic projection of the metal trace on the base substrate at least partially overlaps an orthographic projection of the first groove on the base substrate.

In some embodiments of the disclosure, the first insulating layer group includes a first gate insulating layer, a first interlayer dielectric layer and a second buffer layer, the second insulating layer group includes a second gate insulating layer and a second interlayer dielectric layer.

In some embodiments of the disclosure, the display panel further includes a second groove having a depth substantially identical to that of the second via holes.

In some embodiments of the disclosure, the first groove and the first via holes are formed through an identical patterning process, the second groove and the second via holes are formed through an identical patterning process.

In some embodiments of the disclosure, the bending area further includes a first planarization layer, and the metal trace is located on the first planarization layer.

In some embodiments of the disclosure, the display panel further includes a source electrode and a drain electrode on the first planarization layer, the metal trace, the source electrode and the drain electrode are formed through an identical patterning process.

BRIEF DESCRIPTION OF THE DRAWINGS

The above and other features and advantages of the present disclosure will become more apparent from the detailed description of exemplary embodiments thereof by reference to the accompanying drawings.

DETAILED DESCRIPTION

Exemplary embodiments will now be fully described with reference to the accompanying drawings. However, the exemplary embodiments can be carried out in various forms and should not be construed as being limited to examples set forth herein; rather, these embodiments are provided to make the present disclosure thorough and complete, and to fully convey the conception of the exemplary embodiments to those skilled in the art. The same reference numbers will be used throughout the drawings to refer to the same or like structures, thus the detailed description thereof will be omitted.

Figure 1:
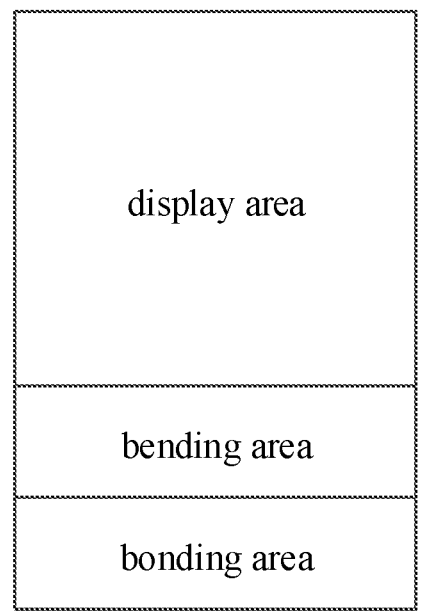
FIG. 1 is a schematic plan view of the OLED display panel of the present disclosure.

FIG. 1 is a schematic plan view of the OLED display panel of the present disclosure. The OLED display panel includes an array substrate, and further includes an anode, a cathode and a light-emitting layer between the anode and the cathode. The array substrate, which is a part of the OLED display panel, is bent such that the OLED display panel includes a display area and a peripheral area. The peripheral area is an area located outside the display area and includes a bending area and a bonding area. The bonding area is used for bonding a circuit board.

Figure 2:
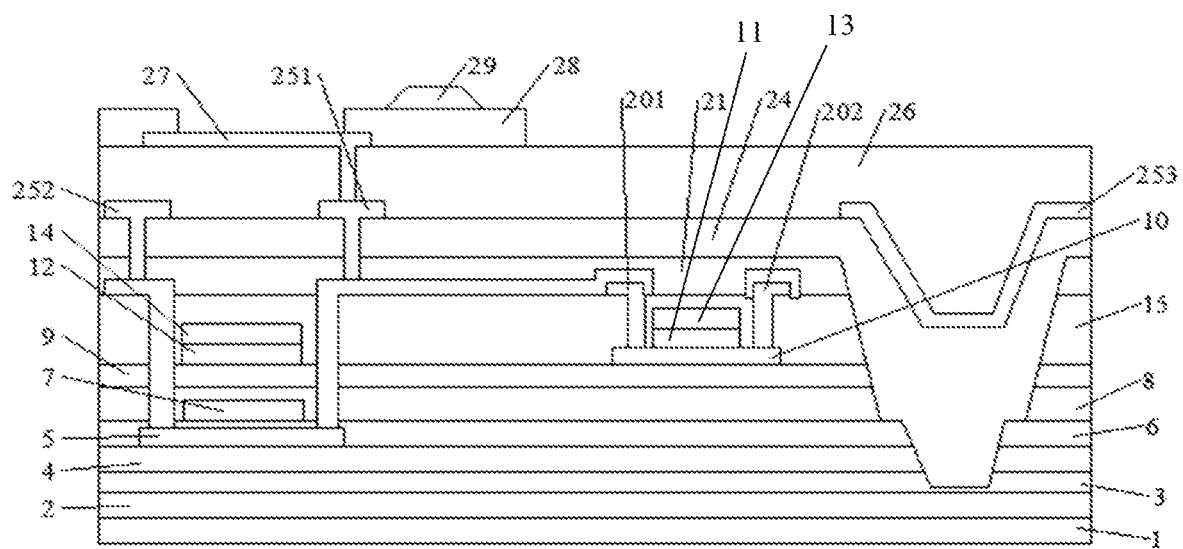
FIG. 2 is a partial cross-sectional view of a low-temperature polysilicon-metal oxide array substrate.

FIG. 2 is a partial cross-sectional view of a low-temperature polysilicon-metal oxide array substrate. The low-temperature polysilicon-metal oxide array substrate includes a base substrate 1 (e.g. glass, plastic); an organic film 2 (e.g. a PI layer) on the base substrate 1, wherein the organic film 2 is a flexible film to be used as a base of the array substrate (in subsequent processes, the base substrate 1 can be peeled off to keep the PI layer which serves as a flexible substrate); a barrier layer 3 on the organic film 2, wherein the barrier layer 3 is used to block water vapor and impurity ions (such as excessive H+) in the PI layer from making an impact on a first semiconductor pattern 5 (polysilicon active layer) that is subsequently formed; a first buffer layer 4 on the barrier layer 3, wherein the first buffer layer 4 functions to further block the water vapor and impurity ions in the PI layer and to add hydrogen ions to the first semiconductor pattern 5 that is subsequently formed; the first semiconductor pattern 5 on the first buffer layer 4, wherein the first semiconductor pattern 5 is made of polysilicon (P—Si); a first gate insulating layer 6 (GI layer) on the first semiconductor pattern 5 and a connecting wire 17 connected with the first semiconductor pattern 5; a first gate electrode 7 on the first gate insulating layer 6; a first interlayer dielectric layer 8 (ILD layer) on the first gate electrode 7; a second buffer layer 9 on the first interlayer dielectric layer 8, wherein the second buffer layer 9 is used to prevent impurity ions such as hydrogen ions from affecting a second semiconductor pattern 10 (a metal oxide active layer) that is formed subsequently; the second semiconductor pattern 10 on the second buffer layer 9, wherein the second semiconductor pattern 10 is made of indium gallium zinc oxide (IGZO); a second gate insulating layer 11 and a second gate electrode 13 as well as a first source electrode 201 and a first drain electrode 202 located on the second semiconductor pattern 10 successively; a second interlayer dielectric layer 15 on the second gate electrode 13; a passivation layer 21 (PVX layer) on the second interlayer dielectric layer 15 and a planarization layer (PLN layer) on the passivation layer 21.

The first semiconductor pattern 5 needs to be annealed at a high temperature of about 350° C. in an air atmosphere after first via holes for accommodating the connecting wires 17 are opened, when the low-temperature polysilicon-metal oxide array substrate as shown in FIG. 2 is manufactured. However, the first source electrode 201 and the first drain electrode 202 on the second semiconductor pattern 10 have been already formed before the high-temperature annealing and the first source electrode 201 and the first drain electrode 202 are generally made of metal selected from Mo, Mo/Al/Mo, Ti, Ti/Al/Ti. The metals easily react with oxygen in the air atmosphere to be oxidized to form an oxide layer during the high-temperature annealing and resistance of the oxide layer will influence the connection performance of the first source electrode 201 and the first drain electrode 202, thus affecting the reliability of a display screen.

Figure 3:
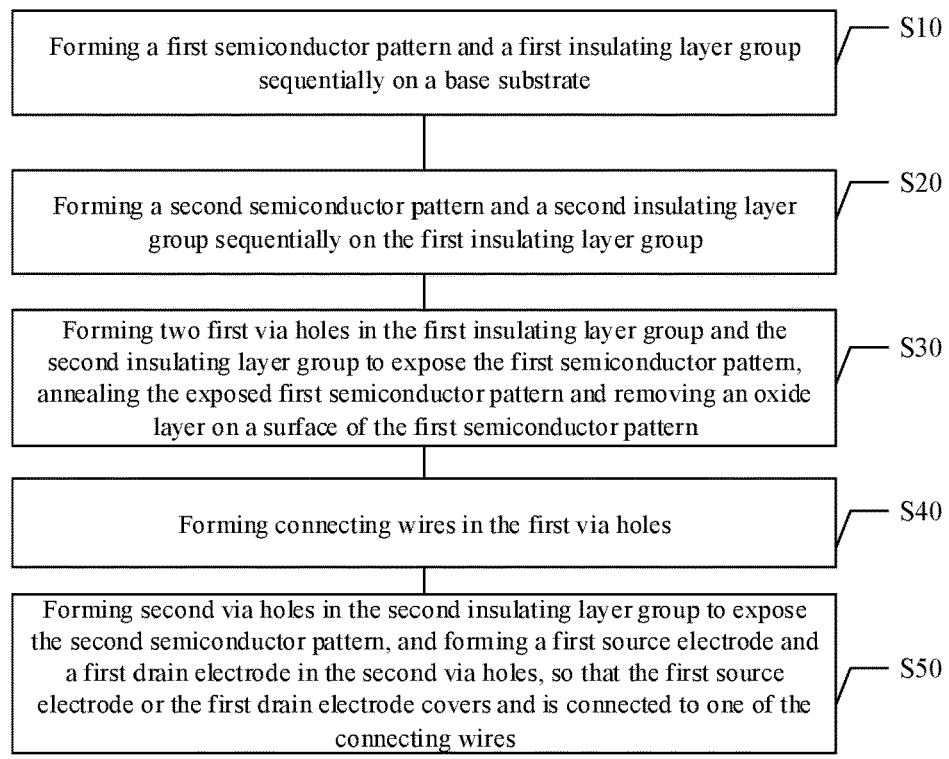
FIG. 3 is a flowchart of a method for manufacturing an array substrate according to the present disclosure.

An exemplary embodiment of the present disclosure provides an OLED display panel and display device. FIG. 3 is a flow chart showing a method for manufacturing an array substrate according to the present disclosure. The method may include the following steps:

In step S10, a first semiconductor pattern 5 and a first insulating layer group are sequentially formed on a base substrate 1.

In step S20, a second semiconductor pattern 10 and a second insulating layer group are sequentially formed on the first insulating layer group.

In step S30, two first via holes 17' are formed in the first insulating layer group and the second insulating layer group to expose the first semiconductor pattern 5, the exposed first semiconductor pattern 5 is annealed and an oxide layer on a surface of the first semiconductor pattern 5 is removed.

In step S40, connecting wires 17 are formed in the first via holes 17'.

In step S50, second via holes 18 are formed in the second insulating layer group to expose the second semiconductor pattern 10, and a first source electrode 201 and a first drain electrode 202 are formed in the second via hole 18, so that the first source electrode 201 or the first drain electrode 202 covers and is connected to one of the connecting wires 17.

The method for manufacturing the array substrate according to the present disclosure will be described in detail below.

The base substrate 1 may be pre-processed before the first semiconductor pattern 5 is formed. Namely, an organic film 2 is formed on the base substrate 1, a barrier layer 3 is formed on the organic film and a first buffer layer 4 is formed on the barrier layer. The function of each layer is the same as that in the array substrate in FIG. 2, and will not be elaborated here.

Figure 4:
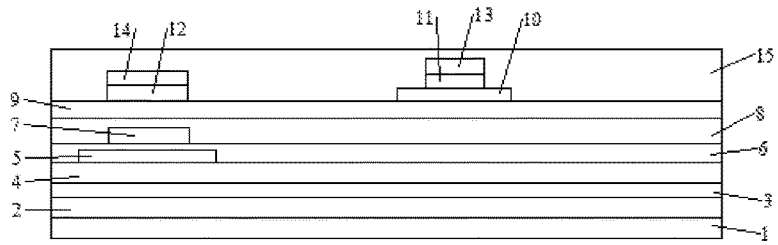
FIGS. 4-8 are schematic diagrams of preparation processes for manufacturing an array substrate according to an exemplary embodiment of the present disclosure.

FIG. 4 is a schematic diagram of preparation processes for manufacturing the array substrate according to an exemplary embodiment of the present disclosure.

In step S10, a first semiconductor pattern 5 and a first insulating layer group are sequentially formed on the base substrate 1.

In this exemplary embodiment, a polysilicon (P—Si) active layer is formed on a first buffer layer 4, and is patterned to form the first semiconductor pattern 5. A first gate insulating layer 6 is formed on the first semiconductor pattern 5 and the first buffer layer 4. A first gate electrode 7 is formed on the first gate insulating layer 6. A first interlayer dielectric layer 8 is formed on the first gate electrode 7 and the first gate insulating layer 6. A second buffer layer 9 is formed on the first interlayer dielectric layer 8, and is used to prevent impurity ions such as hydrogen ions from affecting a second semiconductor pattern 10 (metal oxide active layer) that is subsequently formed. The first insulating layer group includes a first gate insulating layer 6, a first interlayer dielectric layer 8 and a second buffer layer 9.

In step S20, the second semiconductor pattern 10 and a second insulating layer group are sequentially formed on the first insulating layer group.

In this exemplary embodiment, a metal oxide active layer is formed on the second buffer layer 9, and is patterned to form the second semiconductor pattern 10. An orthographic projection of the first semiconductor pattern 5 on the base substrate 1 does not overlap an orthographic projection of the second semiconductor pattern 10 on the base substrate 1. Namely, the orthographic projection of the first semiconductor pattern 5 on the base substrate 1 and the orthographic projection of the second semiconductor pattern 10 on the base substrate 1 are completely misaligned.

An insulating material layer is formed on the second semiconductor pattern 10 and the second buffer layer 9, and is patterned to form a second gate insulating layer 11 and an insulating pattern 12. The second gate insulating layer 11 is located on the second semiconductor pattern 10. An orthographic projection of the insulating pattern 12 on the base substrate 1 overlaps the orthographic projection of the first semiconductor pattern 5 on the base substrate 1. The second gate insulating layer 11 and the insulating pattern 12 are formed in the same patterning process, which can reduce process steps.

A metal material layer is formed on the insulating pattern 12, the second gate insulating layer 11 and the second buffer layer 9, and is patterned to form a second gate electrode 13 and a metal pattern 14. The second gate electrode 13 is located on the second gate insulating layer 11 and the metal pattern 14 is located on the insulating pattern 12. A second interlayer dielectric layer 15 is formed on the second gate electrode 13, the metal pattern 14 and the second buffer layer 9. The second gate electrode 13 and the metal pattern 14 are formed in the same patterning process, which can reduce process steps.

In this exemplary embodiment, the first insulating layer group may include the first gate insulating layer 6, the first interlayer dielectric layer 8 and the second buffer layer 9 sequentially disposed from bottom to top. The second insulating layer group may include the second interlayer dielectric layer 15.

Figure 5:
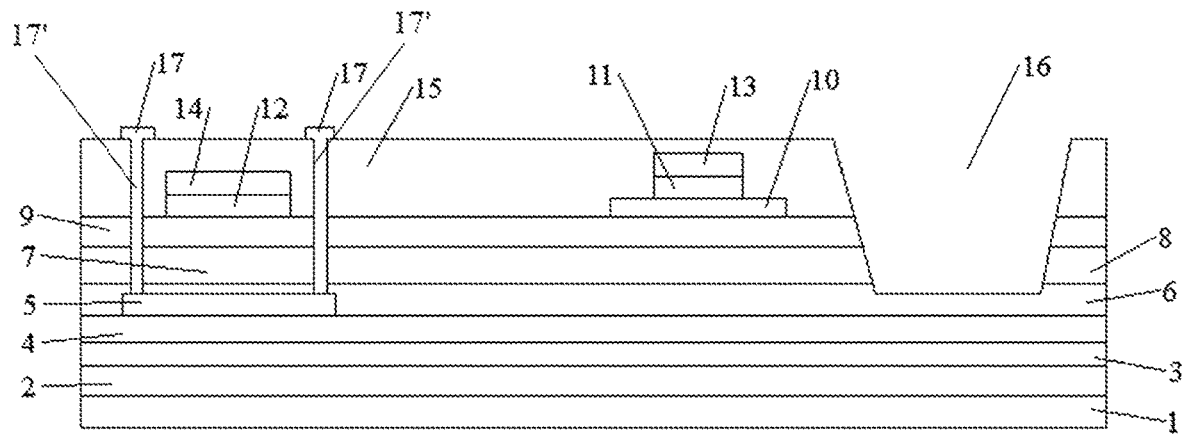

FIG. 5 is a schematic diagram of preparation processes for manufacturing the array substrate according to an exemplary embodiment of the present disclosure.

In step S30, two first via holes 17' are formed in the first insulating layer group and the second insulating layer group to expose the first semiconductor pattern 5, the exposed first semiconductor pattern 5 is annealed and an oxide layer on a surface of the first semiconductor pattern 5 is removed.

In this exemplary embodiment, two first via holes 17' are formed in the first gate insulating layer 6, the first interlayer dielectric layer 8, the second buffer layer 9 and the second interlayer dielectric layer 15 by one etching process to expose the first semiconductor pattern 5 under the first gate insulating layer 6. In a flexible display device, a first groove 16, which has a depth substantially the same as those of the first via holes 17', may be formed in the first insulating layer group in a bending region while the first via holes 17' are formed. In the present disclosure, the term of "substantially the same as/substantially identical to" means that, for example, the depth of the first groove 16 and the depth of the first via hole are the same within an allowable range (e.g., 10%-30%), which will not be repeated below. The first groove 16 and the first via holes 17' are formed through the same patterning process, which can reduce process steps.

The exposed first semiconductor pattern 5 is then annealed at a high temperature of about 350° C. in an air atmosphere or a nitrogen atmosphere, in order to supplement hydrogen to the first semiconductor pattern 5$p$-Si. An oxide layer on a surface of the first semiconductor pattern 5 is then cleaned and removed by using hydrofluoric acid, to prevent resistance of the oxide layer on the surface of the first semiconductor pattern 5 from affecting the connection performance of connecting wires 17 that are subsequently formed, thereby affecting the reliability of a display screen. Furthermore, at this moment, the first source electrode 201 and the first drain electrode 202 have not yet been formed and annealing the first semiconductor pattern 5 will not have an impact on the first source electrode 201 and the first drain electrode 202, which can effectively solve the problem of the compatibility of manufacturing processes of a thin film transistor made of polysilicon and a thin film transistor made of metal oxide, thereby ensuring the stability of the processes.

In step S40, the connecting wires 17 are formed in the first via holes.

In this exemplary embodiment, a first conductive material layer is deposited in the first via holes and on the second interlayer dielectric layer 15. The first conductive material layer is etched to form the connecting wires 17, which are connected to the first semiconductor pattern 5.

In step S50, second via holes 18 are formed in the second insulating layer group to expose a second semiconductor pattern 10 and the first source electrode 201 and the first drain electrode 202 are formed in the second via holes 18 such that the first source electrode 201 or the first drain electrode 202 is electrically connected to or covers one of the connecting wires 17.

Figure 6:
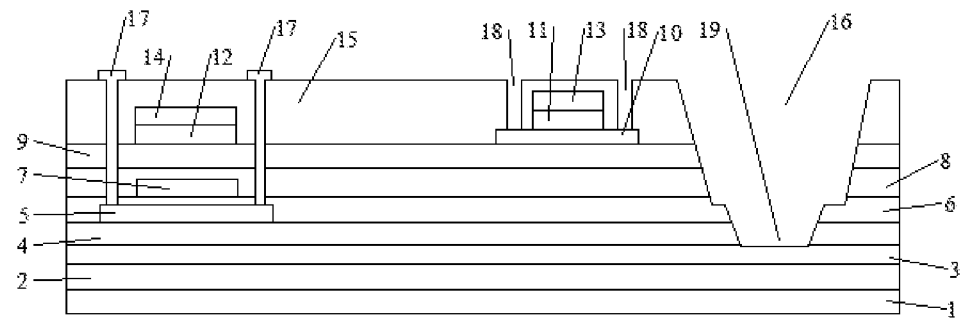

FIG. 6 is a schematic diagram of preparation processes for manufacturing the array substrate according to an exemplary embodiment of the present disclosure.

In this exemplary embodiment, the second via holes 18 are formed in the second interlayer dielectric layer 15 to expose the second semiconductor pattern 10 under the second interlayer dielectric layer 15. A second groove 19 may be formed in the first groove 16 while forming the second via holes 18. That is, the first groove 16 is further deepened at its bottom to form the second groove 19 to fully etch away an inorganic layer in the bending region, which prevents the bending region from being cracked during bending. The second groove 19 has a depth substantially the same as those of the second via holes 18. The second groove 19 and the second via holes 18 are formed in the same patterning process, which can reduce process steps.

Figure 7:
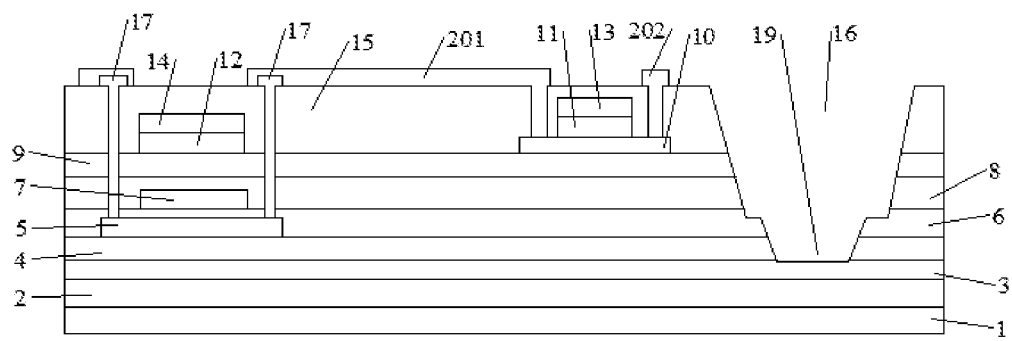

FIG. 7 is a schematic diagram of preparation processes for manufacturing the array substrate according to an exemplary embodiment of the present disclosure.

In this exemplary embodiment, a second conductive material layer is deposited on the second interlayer dielectric layer 15 and in the second via holes 18, and is etched to form the first source electrode 201 and the first drain electrode 202. The first source electrode 201 (which may also be the first drain electrode) covers and is electrically connected to the connecting wire 17 close to it and the first drain electrode 202 far from the connecting wire 17 is not connected to the connecting wire 17. Alternatively, the first drain electrode 202 (which may also be the first source electrode) which is far away from the connecting wire 17 may be connected to the connecting wire 17.

In other exemplary embodiments, the first source electrode 201 may be electrically connected to the other connecting wire 17 away from it, or, the first drain electrode 202 is connected to the other connecting wire 17.

Figure 8:
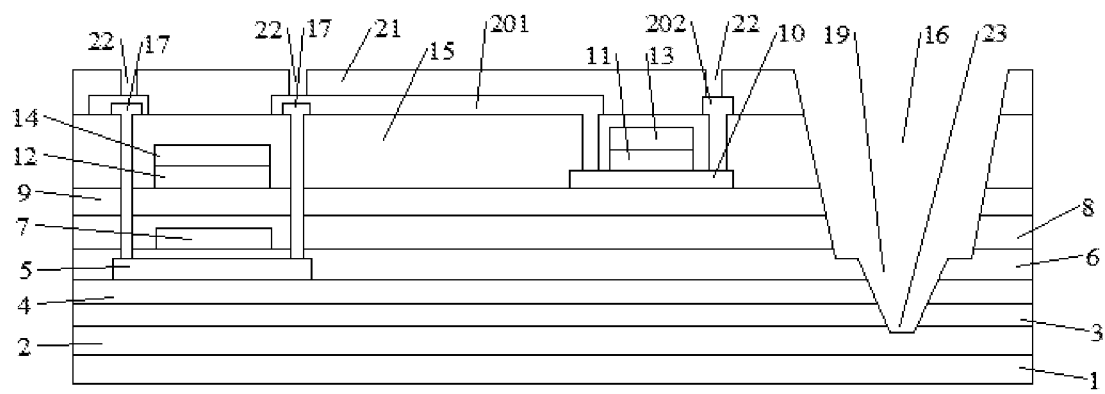
Figure 9:
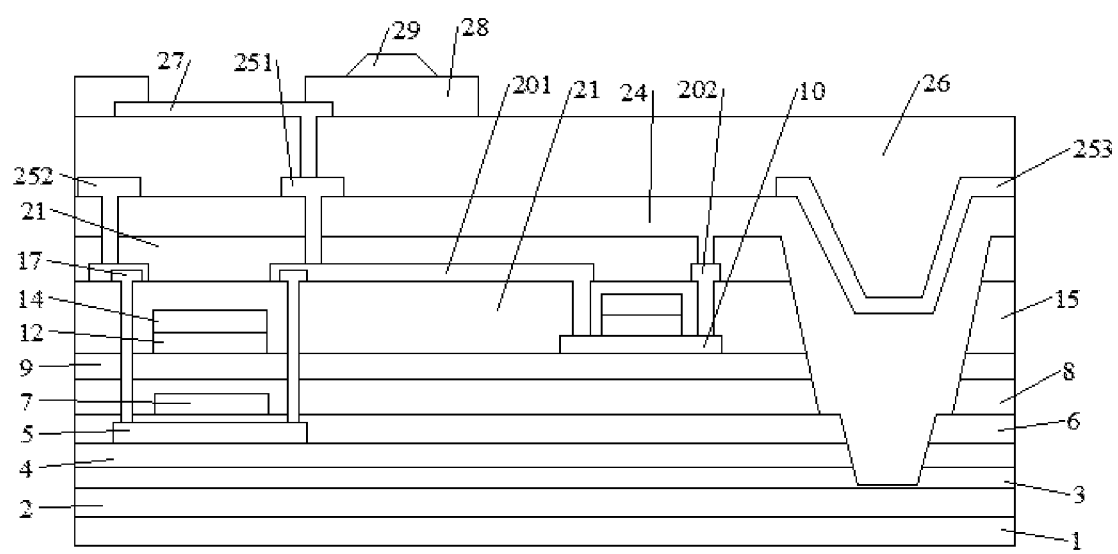
FIG. 9 is a schematic structural diagram of an array substrate according to an exemplary embodiment of the present disclosure.

FIG. 8 is a schematic diagram of preparation processes for manufacturing the array substrate according to an exemplary embodiment of the present disclosure.

In this exemplary embodiment, a passivation layer 21 is formed on the first source electrode 201 and the first drain electrode 202 and three third via holes 22 are formed on the passivation layer 21. The three third via holes 22 are communicated to the connecting wire 17 to which the first source electrode 201 or the first drain electrode 202 is not connected, the first source electrode 201 and the first drain electrode 202, respectively. When a sum of depths of the first groove 16 and the second groove 19 cannot meet the requirements for the etching of the bending region or cannot achieve the etching effect, a third groove 23 can be formed in the second groove 19 while forming the third via holes 23 to fully etch away the inorganic layer in the bending region. That is, the second groove 19 is further deepened at its bottom to form the third groove 23, which has a depth substantially the same as those of the third via holes 22. The third groove 23 and the third via holes 22 are formed in the same patterning process, which can reduce process steps.

FIG. 8 is a schematic structural diagram of the array substrate according to an exemplary embodiment of the present disclosure.

In this exemplary embodiment, a first planarization layer 24 is formed on the passivation layer 21 and fourth via holes are formed on the first planarization layer 24. A third conductive material layer is formed in the fourth via holes and on the first planarization layer 24, and is patterned to form a second source electrode 251 and a second drain electrode 252. The second source electrode 251 is connected to the first source electrode 201 through the fourth via hole and the second drain electrode 252 is connected to the connecting wire 17 to which the first source electrode 201 is not connected through the fourth via hole. Of course, the connection between the second source electrode 251 and the second drain electrode 252 may be different from the connection between the first source electrode and the first drain electrode described above, as long as the first source electrode and the second source electrode 251 are connected, or, the first drain electrode and the second drain electrode are connected, and the remaining second source electrode 251 or the second drain electrode is connected to the connecting wire 17 to which the first source electrode 201 or the first drain electrode 202 is not connected. Therefore, the second source electrode 251 and the second drain electrode 252 are connected to the connecting wire 17 to which the first source electrode 201 or the first drain electrode 202 is not connected and the first source electrode 201 or the first drain electrode 202 to which the connecting wire 17 is connected in a corresponding way. A metal trace 253 is formed on the first planarization layer 24 located in the bending region while patterning the third conductive material layer to form the second source electrode 251 and the second drain electrode 252. An orthographic projection of the metal trace on the base substrate overlaps an orthographic projection of the first groove on the base substrate. The metal trace 253 is used to connect a trace in a display area to a circuit board in a peripheral area. The metal trace 253, the second source electrode 251 and the second drain electrode 252 are formed in the same patterning process, which can reduce process steps.

A second planarization layer 26 is formed on the first planarization layer 24, the second source electrode 251 and the second drain electrode 252 and a fifth via hole is formed on the second planarization layer 26. The fifth via hole is communicated to the second source electrode 251, or can be connected to the second drain electrode 252. A fourth conductive material layer is formed in the fifth via hoe and on the second planarization layer 26, and is patterned to form an anode 27. The anode 27 is connected to the second source electrode 251 through the five via hole included in the second planarization layer 26, and may also be connected to the second drain electrode 252 through the fifth via hole. A pixel defining layer 28 is formed on the array substrate on which the anode 27 is already formed. A blocking wall 29 is formed on the pixel defining layer 28.

Further, the present disclosure further provides an array substrate. FIG. 8 is a schematic structural diagram of the array substrate according to an exemplary embodiment of the present disclosure. The array substrate may include a base substrate 1; a first semiconductor pattern 5 and a first insulating layer group sequentially disposed on the base substrate 1; a second semiconductor pattern 10 and a second insulating layer group, connecting wires 17, a first source electrode 201 and a first drain electrode 202 sequentially disposed on the first insulating layer group. Two first via holes are provided in the first insulating layer group and the second insulating layer group to expose the first semiconductor pattern 5. The connecting wires 17 are provided in the first via holes. Second via holes 18 are provided on the second insulating layer group to expose the second semiconductor pattern 10. The first source electrode 201 and the first drain electrode 202 are disposed in the second via holes 18 and the first source electrode 201 or the first drain electrode 202 covers and is connected to one of the connecting wires 17.

When the first source electrode 201 or the first drain electrode 202 is electrically connected to or covers one of the connecting wires 17, it is necessary to form the first via holes and the connecting wires 17 first and then form the second via holes 18, the first source electrode 201 and the first drain electrode 202, which prevents the formation of the first via holes and the connecting wires 17 from influencing the first source electrode 201 and the first drain electrode 202.

In this exemplary embodiment, an orthographic projection of the first semiconductor pattern 5 on the base substrate 1 does not overlap an orthographic projection of the second semiconductor pattern 10 on the base substrate 1.

In this exemplary embodiment, the first semiconductor pattern 5 and the second semiconductor pattern 10 are made of different materials.

In this exemplary embodiment, the first semiconductor pattern 5 is made of polysilicon and the second semiconductor pattern 10 is made of metal oxide.

Specific structures of the array substrate have been described in detail in the above-described method for manufacturing the array substrate, which will not be elaborated here.

Further, the present disclosure further provides an OLED display device which may include the above-mentioned OLED display panel. The display device can be any product or component with a display function, such as an electronic paper, an OLED panel, a mobile phone, a tablet computer, a TV, a monitor, a notebook computer, a digital photo frame, a navigator, etc. The structure of the display panel has been described in detail above, so it will not be elaborated here.

The above-described features, structures or characteristics may be combined in one or more embodiments in any appropriate way. Wherever possible, features discussed in each embodiment are interchangeable. In the foregoing description, many specific details are provided for fully understanding embodiments of the present disclosure. However, it will be appreciated by those skilled in the art that technical solutions of the present disclosure can be practiced with one or more of the specific details being omitted, or, other methods, components, and materials may be used. Under other circumstances, well-known structures, materials, or operations will not be illustrated or described in detail, to avoid obscuration of various aspects of the present disclosure.

Although terms having opposite meanings such as "up" and "down" are used herein to describe the relationship of one component relative to another component, such terms are used herein only for the sake of convenience, for example, "in the direction illustrated in the figure". It can be understood that if a device denoted in the drawings is turned upside down, a component described as "above" something will become a component described as "under" something. When a structure is described as "above" another structure, it probably means that the structure is integrally formed on another structure, or, the structure is "directly" disposed on another structure, or, the structure is "indirectly" disposed on another structure through an additional structure.

Words such as "one", "an/a", "the", and "said" are used herein to indicate the presence of one or more elements/component parts/and others. Terms "including", "comprising", and "having" have an inclusive meaning which means that there may be additional elements/component parts/and others in addition to the listed elements/component parts/and others. Terms "first", "second", and "third" are used herein only as markers, and they do not limit the number of objects modified after them.

It should be understood that the application of the present disclosure is not limit to the detailed structure and arrangement of components provided in this specification. The present disclosure can have other embodiments, and can be implemented and carried out in various ways. The aforementioned variations and modifications fall within the scope of the present disclosure. It should be understood that the disclosure disclosed and defined in this specification may extend to all alternative combinations of two or more individual features that are apparent or mentioned in the text and/or drawings. All of the different combinations form various alternative aspects of the present disclosure. Embodiments described in this specification illustrate the best modes known for carrying out the present disclosure, and will allow those skilled in the art to utilize the present disclosure.

What is claimed is:

1. An OLED display panel, comprising:
    a display area, a bending area and a bonding area for bonding a circuit board,
    wherein the display panel further comprises:
    a base substrate;
    a first semiconductor pattern on the base substrate;
    a first insulating layer group on the first semiconductor pattern;
    a second semiconductor pattern on the first insulating layer group;
    a second insulating layer group on the second semiconductor pattern;
    first via holes in the first insulating layer group and the second insulating layer group;
    second via holes in the second insulating layer group,
    wherein the display panel further comprises:
    a first groove located in the bending area and having a depth substantially identical to that of the first via holes; and
    a metal trace, connecting a trace in the display area to the circuit board.

2. The OLED display panel according to claim 1, wherein an orthographic projection of the first semiconductor pattern on the base substrate does not overlap an orthographic projection of the second semiconductor pattern on the base substrate.

3. The OLED display panel according to claim 1, wherein the first semiconductor pattern and the second semiconductor pattern are made of different materials.

4. The OLED display panel according to claim 1, wherein the first semiconductor pattern is made of polysilicon and the second semiconductor pattern is made of metal oxide.

5. The OLED display panel according to claim 1, wherein an orthographic projection of the metal trace on the base substrate at least partially overlaps an orthographic projection of the first groove on the base substrate.

6. The OLED display panel according to claim 1, wherein the first insulating layer group comprises a first gate insulating layer, a first interlayer dielectric layer and a second buffer layer, the second insulating layer group comprises a second gate insulating layer and a second interlayer dielectric layer.

7. The OLED display panel according to claim 1, wherein the display panel further comprises a second groove having a depth substantially identical to that of the second via holes.

8. The OLED display panel according to claim 7, wherein the first groove and the first via holes are formed through an identical patterning process, the second groove and the second via holes are formed through an identical patterning process.

9. The OLED display panel according to claim 1, wherein the bending area further comprises a first planarization layer, and the metal trace is located on the first planarization layer.

10. The OLED display panel according to claim 9, wherein the display panel further comprises a source electrode and a drain electrode on the first planarization layer, the metal trace, the source electrode and the drain electrode are formed through an identical patterning process.

11. An OLED display device, comprising an OLED display panel, OLED display panel comprising a display area, a bending area and a bonding area for bonding a circuit board,
wherein the display panel further comprises:
a base substrate;
a first semiconductor pattern on the base substrate;
a first insulating layer group on the first semiconductor pattern;
a second semiconductor pattern on the first insulating layer group;
a second insulating layer group on the second semiconductor pattern;
first via holes in the first insulating layer group and the second insulating layer group;
second via holes in the second insulating layer group, wherein the display panel further comprises:
a first groove located in the bending area and formed through an identical patterning process with the first via holes; and
a metal trace, connecting a trace in the display area to the circuit board.

12. The OLED display device according to claim 11, wherein an orthographic projection of the first semiconductor pattern on the base substrate does not overlap an orthographic projection of the second semiconductor pattern on the base substrate.

13. The OLED display device according to claim 11, wherein the first semiconductor pattern and the second semiconductor pattern are made of different materials.

14. The OLED display device according to claim 11, wherein the first semiconductor pattern is made of polysilicon and the second semiconductor pattern is made of metal oxide.

15. The OLED display device according to claim 11, wherein an orthographic projection of the metal trace on the base substrate at least partially overlaps an orthographic projection of the first groove on the base substrate.

16. The OLED display device according to claim 11, wherein the first insulating layer group comprises a first gate insulating layer, a first interlayer dielectric layer and a second buffer layer, the second insulating layer group comprises a second gate insulating layer and a second interlayer dielectric layer.

17. The OLED display device according to claim 11, wherein the display panel further comprises a second groove, wherein the second groove has a depth substantially identical to that of the second via holes, and the second groove and the second via holes are formed through an identical patterning process.

18. The OLED display device according to claim 11, wherein the first groove has a depth substantially identical to that of the first via holes.

19. The OLED display device according to claim 11, wherein the bending area further comprises a first planarization layer, and the metal trace is located on the first planarization layer.

20. The OLED display device according to claim 19, wherein the display panel further comprises a source electrode and a drain electrode on the first planarization layer, the metal trace, the source electrode and the drain electrode are formed through an identical patterning process.

* * * * *